(12) United States Patent
Kurokami

(10) Patent No.: US 7,024,608 B2
(45) Date of Patent: Apr. 4, 2006

(54) TRANSMITTING METHOD AND TRANSMITTING APPARATUS

(75) Inventor: Yuzo Kurokami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/508,677

(22) PCT Filed: Feb. 19, 2003

(86) PCT No.: PCT/JP03/01822

§ 371 (c)(1),
(2), (4) Date: Sep. 22, 2004

(87) PCT Pub. No.: WO03/081867

PCT Pub. Date: Oct. 2, 2003

(65) Prior Publication Data

US 2005/0210354 A1    Sep. 22, 2005

(30) Foreign Application Priority Data

Mar. 22, 2002    (JP)    ............................. 2002-080790

(51) Int. Cl.
*G11B 5/00* (2006.01)
*G06F 11/00* (2006.01)
*H03D 3/00* (2006.01)

(52) U.S. Cl. ........................ 714/746; 714/700; 329/318

(58) Field of Classification Search ...................... None
See application file for complete search history.

(56) References Cited

U.S. PATENT DOCUMENTS

| | | | |
|---|---|---|---|
| 4,615,038 A * | 9/1986 | Lim et al. | 375/232 |
| 5,339,054 A | 8/1994 | Taguchi | |
| 5,802,451 A | 9/1998 | Adachi et al. | |
| 6,646,501 B1 * | 11/2003 | Wessel | 330/10 |
| 6,757,525 B1 * | 6/2004 | Ishikawa et al. | 455/114.3 |

FOREIGN PATENT DOCUMENTS

| | | |
|---|---|---|
| AU | 666093 B | 1/1994 |
| AU | A-41698/93 | 1/1994 |
| CA | 2099410 | 1/1994 |
| JP | 59-91711 | 5/1984 |
| JP | 62-269429 | 11/1987 |
| JP | 4-291829 | 10/1992 |
| JP | 06-021990 | 1/1994 |
| JP | 06-276033 | 9/1994 |
| JP | 07-202955 | 8/1995 |
| JP | 09-064932 | 3/1997 |
| JP | 11-8660 | 1/1999 |
| JP | 2000-299652 | 10/2000 |
| JP | 2001-016283 | 1/2001 |
| JP | 3166321 | 3/2001 |
| JP | 3169803 | 3/2001 |
| JP | 2001-284980 | 10/2001 |
| JP | 2001-333124 | 11/2001 |
| JP | 2002-077285 | 3/2002 |

* cited by examiner

*Primary Examiner*—Christine T. Tu
(74) *Attorney, Agent, or Firm*—Young & Thompson

(57) ABSTRACT

Ideal nonlinear distortion compensation is realized by removing an imperfection of amplitude delay characteristic and an affection of inherent deviation that an amplifier has. A linear distortion compensation factor calculating part (18) estimates, based on quadrature demodulated signals (I'ch, Q'ch), the linear distortion characteristic occurring mainly due to imperfection of analog circuits, such as a quadrature modulator (13) and a high-power amplifier (14), and calculates and outputs a linear distortion compensation factor for compensating the linear distortion. A linear distortion compensating part (12) performs a pre-distortion (addition of a reverse characteristic of the linear distortion characteristic) by multiplying the baseband signals (Ich, Qch) by the data of the linear distortion compensation factor.

9 Claims, 17 Drawing Sheets

TRANSMITTING METHOD AND TRANSMITTING APPARATUS

TECHNICAL FIELD

The present invention mainly relates to a transmission method and a transmitter for use in digital radio communication systems, and in detail, relates to a transmission method and a transmitter for compensating for nonlinear distortions caused by amplifying radio frequency (hereinafter referred to as RF) signals.

BACKGROUND ART

In a demodulator for use in digital radio communication systems, nonlinear distortions caused by amplifying RF signals have been compensated conventionally. FIG. 9 is a block diagram showing the configuration of a conventional system for compensating for nonlinear distortions. As shown in FIG. 9, the system comprises a nonlinear distortion compensation processing unit 11, a quadrature modulator 13, a high output amplifier 14, a quadrature demodulator 15, and a nonlinear distortion compensation coefficient calculation unit 17. The apparatus shown in FIG. 9 is intended for quadrature amplitude modulation (QAM), and is applied a baseband quasi-synchronization system which is a common digital demodulation system. Further, in the explanation for the operation of the apparatus shown in FIG. 9, typical indications of Ich and Qch are used for in-phase and quadrature components (channels), respectively.

Each element of the apparatus shown in FIG. 9 will be described in detail below. The nonlinear distortion compensation processing unit 11 has a function of performing nonlinear distortion compensations to baseband signals for Ich and Qch input into terminals 1 and 2, respectively, and outputting them. The quadrature modulator 13 has a function of quadrature-modulating baseband signals for Ich and Qch, to which nonlinear distortion compensations have been performed, and outputting the quadrature modulated signals. The high output amplifier 14 has a function of amplifying the quadrature modulated signals and outputting them as modulated signals, which are output to the outside through a terminal 3.

The quadrature demodulator 15 has a function of outputting quadrature demodulated signals I'ch and Q'ch generated by quadrature-demodulating the quadrature modulated signals output from the high output amplifier 14. The nonlinear distortion compensation coefficient calculation unit 17, into which the baseband signals Ich and Qch and the quadrature demodulated signals I'ch and Q'ch are input, has a function of calculating and outputting a nonlinear distortion compensation coefficient based on the inverse characteristics of the nonlinear characteristics corresponding to the amplitude of the baseband signals. The nonlinear distortion compensation processing unit 11 has a function of multiplying the baseband signals Ich and Qch by data of the nonlinear distortion compensation coefficient, and performing a predistortion (addition of the inverse characteristics of the nonlinear distortion characteristics).

Here, brief explanations will be given for nonlinear distortions caused in the high output amplifier 14 with a radio frequency (RF) band, and for an influence of the linear distortions on transmitted signals. Note that the characteristics of the high output amplifier 14 are shown in dB. It is defined that the input level of the high output amplifier is Pi, the output level is Po, the amplification gain is G, and the saturation power level is Psat. Assuming that the high output amplifier 14 has ideal characteristics, a value, obtained by summing the input level Pi and the amplification gain G, is output, unless the output level Po is equal to or exceeds the saturation power level Psat. Thus, the input/output characteristics of the high outuput amplifier 14 is expressed as the following equation (1):

$$P_0 = \begin{Bmatrix} P_i + G (P_0 < P_{sat}) \\ P_{sat} (P_0 \geq P_{sat}) \end{Bmatrix} \quad (1)$$

However, if the high output amplifier 14 is configured with practical electric circuits, the output level Po is gradually compressed as the output level Po comes close to the saturation power level Psat, whereby the characteristic difference between the practical amplifier and an ideal amplifier increases. According to a literature, Behavioral Modeling of Nonlinear RF and Mocrowave Device, by Thomas r. Turlington, Artech House, the input/output characteristics of an amplifier, taking into account the compression effect, can be approximated by the following equation (2).

$$Po = Pi + G - K \cdot \log_{10}\left[1 + 10\left\{\frac{Pi + G - Psat}{K}\right\}\right] \quad (2)$$

Here, K is a positive number, which is an amplitude compression coefficient showing the characteristics of the amplifier. As K increases, the characteristics of the amplifier degrade. In contrast, as K comes close to zero, the characteristics of the amplifier becomes close to the characteristics of an ideal amplifier.

Further, with reference to the equation (2), if defining that the saturation power level Psat is a reference point (0 dB), Pi+G is the operating point of the amplifier, and the output level is Pop, respectively, the relationship between the operating point and the output level of the high output amplifier 14 is shown as the following equation (3):

$$Po = Pop - K \cdot \log_{10}\left[1 + 10^{\left(\frac{Pop}{K}\right)}\right] \quad (3)$$

FIG. 10 shows characteristics against output of the operating point of the amplifier, in a case that the vertical axis shows the output level, K→0, and K=3, 5, 7. Here, the horizontal axis shows the operating point of the amplifier, and the vertical axis shows the output level. As shown in FIG. 10, in the case of an ideal amplifier (K→0), the operating point linearly operates until it comes to the saturation power, and once it came to the saturation power, the power is immediately clipped to the saturation point. Further, the Figure shows that as the amplitude compression coefficient K increases, the characteristic difference from the ideal amplifier becomes large, causing the linear operation to be less performed before the operating point level exceeds the saturation point (0 dB).

The modulated signals to be demodulated by the demodulated apparatus, shown in FIG. 9, are quadrature amplitude modulated (QAM) signals in which signal points have plural amplitudes. Therefore, when the aforementioned nonlinear operation occurs, there arises an influence of nonlinear distortions with different compressibility on each signal point, corresponding to the signal amplitude.

FIG. 11 shows an example of a signal point arrangement of quadrature amplitude modulated signals to be demodulated by the demodulator shown in FIG. 9. FIG. 11(a) shows a normal signal point arrangement of QAM signals which are sixteen quadrature amplitude modulated signals, and FIG. 11(b) shows a signal point arrangement, in which only a first quadrant in the signal arrangement shown in FIG. 11(a) is extracted. It should be noted that in FIGS. 11(a) and 11(b), black circles show signal points, and + symbols show normal positions of the signal points. FIGS. 11(a) and 11(b) show the state where the black circles and + symbols of the signal points overlap with each other.

As shown in FIG. 11(a), the normal signal point arrangements of the sixteen quadrature amplitude modulated signals exist on first to forth quadrants defined by the horizontal axis Ich and the vertical axis Qch, with four points having the same amplitude, respectively, in the same manner. Hereinafter, the signal point arrangement will be explained with respect to the first quadrant only, since the amplitudes are same in the second to the forth quadrants and the operations thereof are also similar. Further, the four points in the signal point arrangement of the first quadrant are named point A, point B, point C and point D, respectively, for convenience.

FIG. 12 shows a signal point arrangement on the first quadrant when the sixteen quadrature amplitude modulated signals are affected by a nonlinear distortion. Here, the black circles also represent signal points and the + symbols also represent normal positions of the signal points. FIG. 12 shows a state where the black circles showing the signal points are shifted from the + symbols showing the signal points due to a nonlinear distortion.

As shown in FIG. 12, the outside signals (points A, B and C) with larger amplitudes are more affected by the nonlinear distortion, comparing with the inside signal (point C) having a smaller amplitude, whereby the shifted amounts of the outside signals from the normal signal point positions indicated by the + symbols are large. In particular, the signal point on the outermost side with the largest amplitude, as the point B, is shifted significantly.

When demodulating such a signal, the margin between the demodulated signal point and the judgment area is small, whereby the outer side signal is more affected by noise, and the error rate becomes worse. Note that the boundaries shown by dashed lines in FIG. 12 are divisions of the signal judgment areas.

When expressing the equation (3) by assigning a variable x as the operating point power and a generalized function F(x) as the output power, the following equation (4) is established:

$$Po = F(Pop), F(X) = X - K \cdot \log_{10}\left[1 + 10^{\left(\frac{X}{K}\right)}\right] \quad (4)$$

When using the inverse function of F(x), the following equation (5), in which the input is the output power and the output is the operation point power, inversely, can be established:

$$Pop = F^{-1}(Po) \quad (5)$$

It is difficult to express the inverse function, used in the equation (5), as a formula. However, since Pop and Po in the equation (4) have a relationship of one to one, the relationship in the equation (5) can be expressed in FIG. 13, using a numerical calculation by assigning a parameter K. In FIG. 13, nonlinear distortions caused in the RF amplifier are expressed as the characteristics of the operating point level (dB) with reference to the output level (dB). The output level shown by the horizontal axis corresponds to the input power into the nonlinear distortion compensation processing unit 11, and the operation point level shown by the vertical axis corresponds to the output level after the predistortion is performed.

Further, when defining the amplitude ratio of the output power to the operating point power as the amplitude compensation rate Re, and the amplitude of the output power as the input amplitude of the quadrature demodulator 15, the amplitude compensation rate characteristics of the quadrature demodulator 15 to the input amplitude can be expressed as shown in FIG. 14.

In FIG. 14, the horizontal axis shows the ratio to the amplitude of the saturation power in dB. Thereby, if the operating points of the output signals of the high output amplifier can be estimated, the amplitude compensation rate can be calculated by converting the input amplitude of the nonlinear distortion compensation processing unit 11 into dB. Hereinafter, the operating point of the average signal power is defined as the average operating point. An influence of the amplitude distortions can be compensated by tracking the average operating point corresponding to the adaptive operation, calculating the amplitude compensation rate according to the operating point of the average signal power detected and the input amplitude of the nonlinear distortion compensation processing unit 11, and multiplying the input signals by the amplitude compensation rate.

FIG. 15 is a block diagram showing the configuration of the nonlinear distortion compensation coefficient calculation unit 17. As shown in FIG. 15, the nonlinear distortion compensation coefficient calculation unit 17 comprises: a root-sum-square calculation circuit 23, an amplitude compensation rate calculation table processing circuit 24, an average operating point estimation circuit 25, a compensation polarity detection circuit 26, a judgment circuit 27, terminals 56 to 59, and a terminal 60. To the terminals 56 and 57, baseband signals Ich and Qch are input, respectively. The root-sum-square calculation circuit 23 outputs signals, which are resultants of calculating root sum square of the amplitude of the respective baseband signals Ich and Qch, as an input amplitude to the amplitude compensation rate calculation table processing circuit 24.

To the terminals 58 and 59, quadrature demodulated signals Ich' and Qch' are input, respectively. The judgment circuit 27 judges a transmitted symbol based on the quadrature demodulated signals Ich' and Qch', and generates and outputs data signals and error signals. The compensation polarity detection circuit 26, corresponding to the result of judging the appropriateness of the amplitude distortion compensation based on the compensation polarity area defined by the boundary where the vector of the input error signal becomes perpendicular to the vector of the data signal, generates a control signal for adjusting the compensation amount in the amplitude distortion compensation, and output it to the average operating point estimation circuit 25.

FIG. 16 is a chart showing an example of a compensation polarity detection area for detecting an influence of distortion from a signal point arrangement. The compensation polarity detection circuit 26 estimates an area where data exist according to the data signals output from the judgment circuit 27, and detects an influence of distortions based on judgment reference data which vary according to the area where the signals exist, and on the error signals. More specifically, in the compensation polarity detection circuit 26, the origin 0 of the signal point arrangement and the normal signal point position are linked by a straight line, and a straight line perpendicular to the straight line is set as a boundary, and by judging the inside of the boundary (origin 0 side, no shading) as an area affecting the positive nonlinear distortion, and by judging the outside of the boundary (shaded parts) as an area affecting the negative nonlinear distortion, an adaptive operation is performed so that the both judged areas are generated with the equal possibility.

The average operating point estimation circuit 25 generates and outputs an average operation point estimation value by adaptively changing it, corresponding to the control signal output from the compensation polarity detection circuit 26. The amplitude compensation rate calculation table processing circuit 24 has an amplitude compensation rate calculation table, with which an amplitude compensation rate can be delivered by assigning an average operating point estimated value output from the average operating point estimation circuit 25 and an input amplitude output from the root-sum-square calculation circuit 23. The amplitude compensation rate calculation table processing circuit 24 outputs data of amplitude compensation rate, delivered from the table, which data is output to the outside through the terminal 60.

FIG. 17 is a block diagram showing the configuration of the nonlinear distortion compensation processing unit 11. As shown in FIG. 17, the nonlinear distortion compensation processing unit 11 comprises terminal 51 to 55, and two multipliers 21. To the terminals 51 and 52, baseband signals Ich and Qch from the terminals 1 and 2 are input, respectively. To the terminal 55, an amplitude compensation rate signal is input. Respective multipliers 21 multiply the input baseband signals Ich and Qch by the amplitude compensation rate signal, respectively, and output the resultant signals. The resultant signals output from the multipliers 21 are output through the terminals 53 and 54, respectively.

However, the nonlinear distortion compensation operation described above uses the result obtained by a numerical calculation based on the expected characteristics of the high output amplifier 14. Thereby, there has been a problem that expected nonlinear distortion compensation characteristics may not be exhibited when the operation is affected by incompleteness of the amplitude delay characteristics or an intrinsic deviation, that the quadrature modulator 13 or the high output amplifier 14 have.

In other words, since a conventional demodulator performs only nonlinear compensations on the transmitter side, linear distortions caused by the incompleteness of the amplitude delay characteristics or intrinsic deviation of an analog circuit are not reduced. Thereby, there has been a problem that an effect of the nonlinear distortion compensation characteristics may not be fully exhibited due to the influence of the linear distortions.

It is therefore an object of the invention to provide a transmitter, capable of performing an ideal nonlinear distortion compensation, in which an influence of incompleteness of the amplitude delay characteristics or an intrinsic deviation, that an amplifier has, is eliminated.

DISCLOSURE OF THE INVENTION

In order to solve the aforementioned problems, a transmission method according to the present invention is for compensating for nonlinear distortions caused by amplifying modulated signals obtained by modulating baseband signals to have a radio frequency band, which comprises the step of compensating for, in addition to the nonlinear distortions, linear distortions by adding inverse characteristics of linear distortion characteristics that amplified modulated signals have. Note that linear distortions may be compensated before nonlinear distortions are compensated, or nonlinear distortions may be compensated before linear distortions are compensated.

As described above, in the transmission method of the present invention, linear distortions are compensated by adding inverse characteristics of the linear distortion characteristics that the amplified modulated signals have, in addition to the nonlinear distortions caused by amplifying modulated signals being compensated.

Therefore, according to the present invention, an influence of incompleteness of amplitude delay characteristics or an intrinsic deviation that an analog circuit has can be eliminated by compensating for linear distortions, whereby it is possible to enhance the accuracy of predistortion for compensating for nonlinear distortions in a high output amplifier, and to perform an ideal nonlinear distortion compensation.

Further, a transmitter for carrying out the transmission method of the present invention is one in which nonlinear distortions are compensated, the nonlinear distortions being caused by amplifying modulated signals obtained by modulating baseband signals to have a radio frequency signal. The transmitter comprises: a quadrature demodulator which outputs quadrature demodulated signals obtained by demodulating the modulated signals; a linear distortion compensation coefficient calculation unit for calculating and outputting a linear distortion compensation coefficient for compensating for linear distortions contained in the quadrature demodulated signals; and a linear distortion compensation processing unit for multiplying the baseband signals by data of the linear distortion compensation coefficient and outputting resultant signals.

Therefore, according to the present invention, an influence of incompleteness of amplitude delay characteristics or an intrinsic deviation that an analog circuit has can be eliminated by compensating for linear distortions, whereby it is possible to enhance the accuracy of predistortion for compensating for nonlinear distortions in a high output amplifier, and to perform an ideal nonlinear distortion compensation.

BEST MODE FOR CARRYING OUT THE INVENTION

Figure 1:
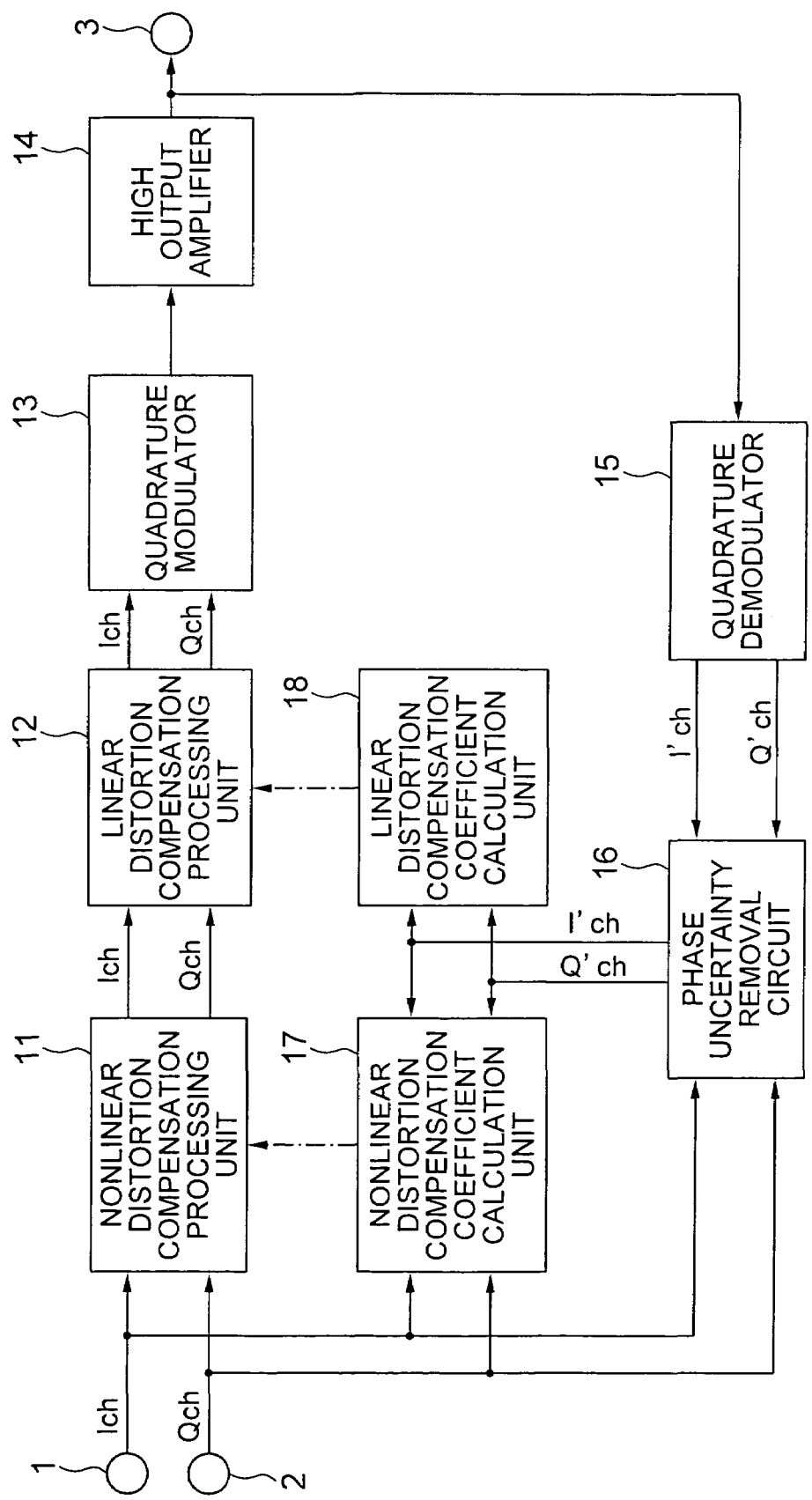
FIG. 1 is a block diagram showing the configuration of a transmitter according to a first embodiment of the present invention.
Figure 9:
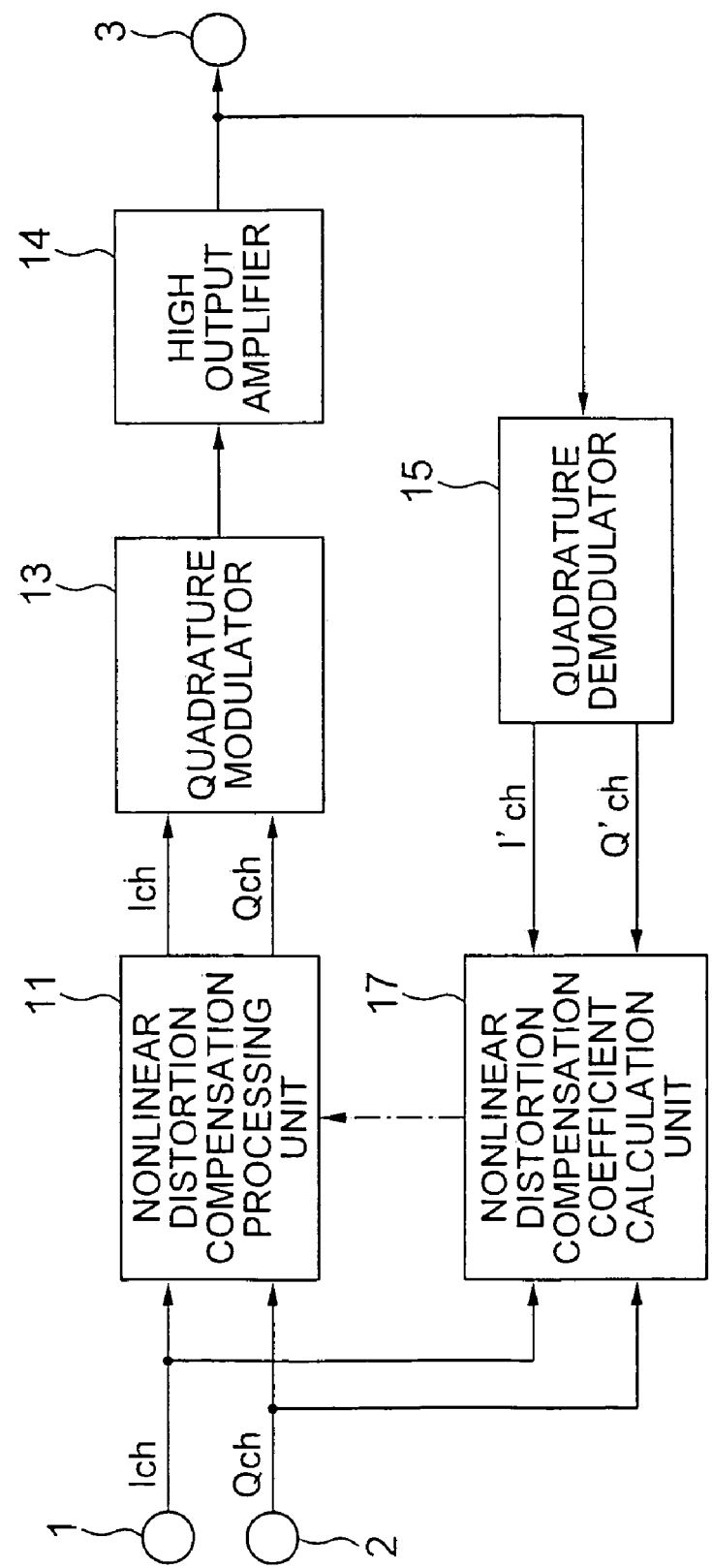
FIG. 9 is a block diagram showing a conventional system configuration for compensating for nonlinear distortions.
Figure 10:
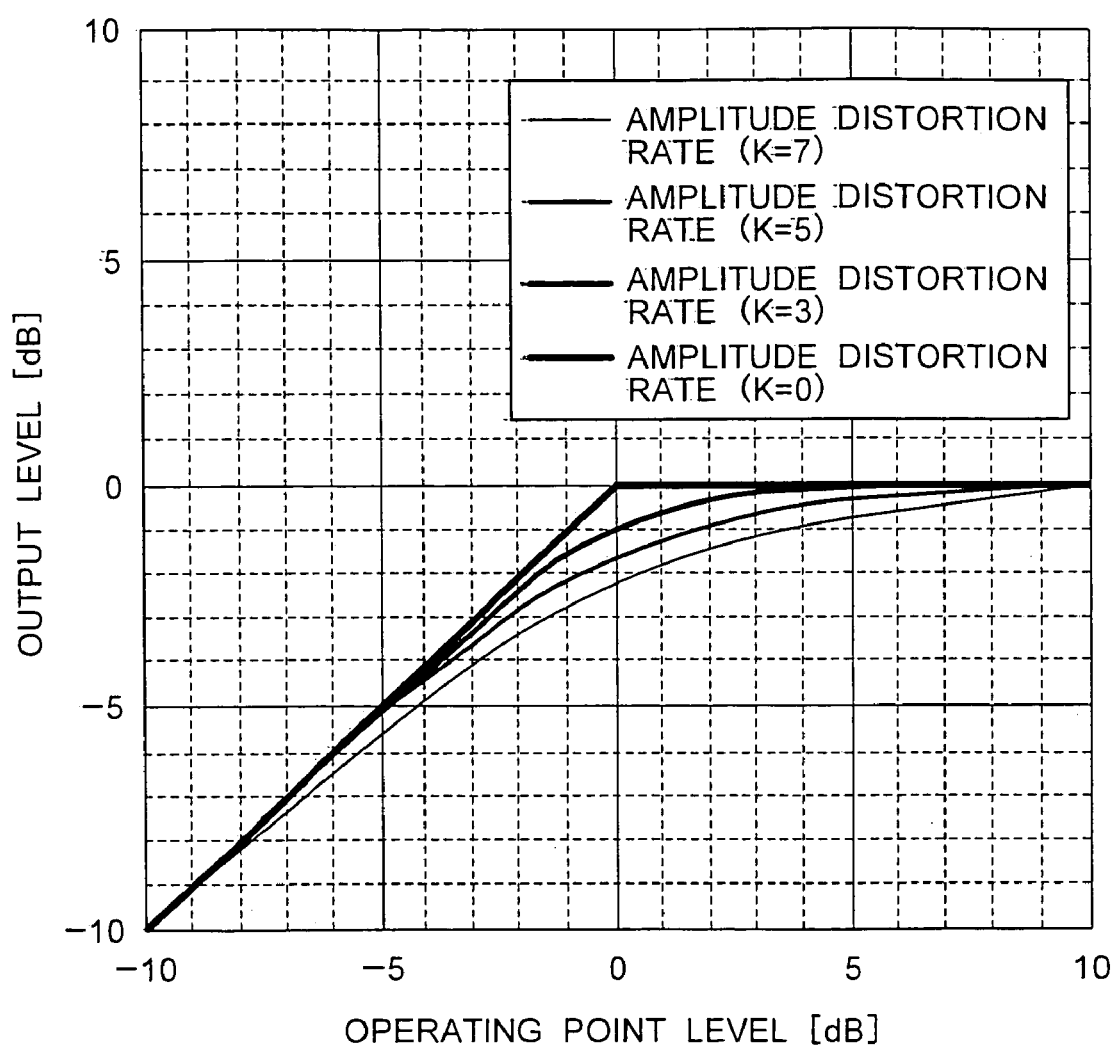
FIG. 10 is a graph showing characteristics against output of an operating point of the amplifier.
Figure 11A:
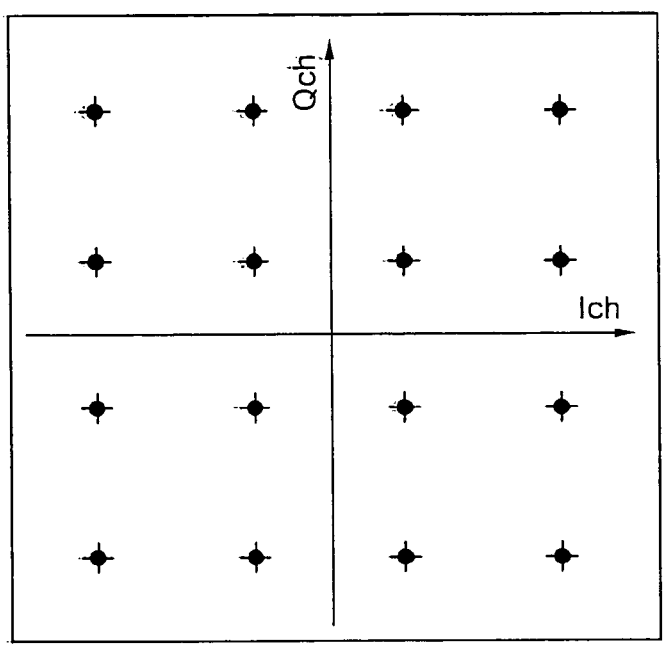
FIG. 11 is a chart showing an signal point arrangement of QAM signals to be demodulated by the demodulator of the present embodiment.
Figure 11B:
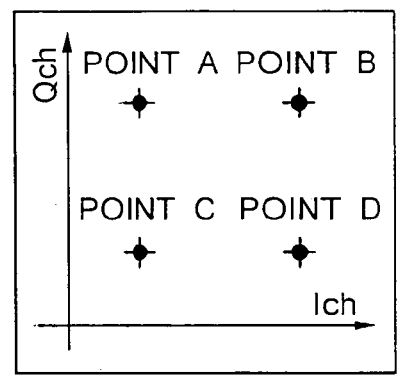
Figure 12:
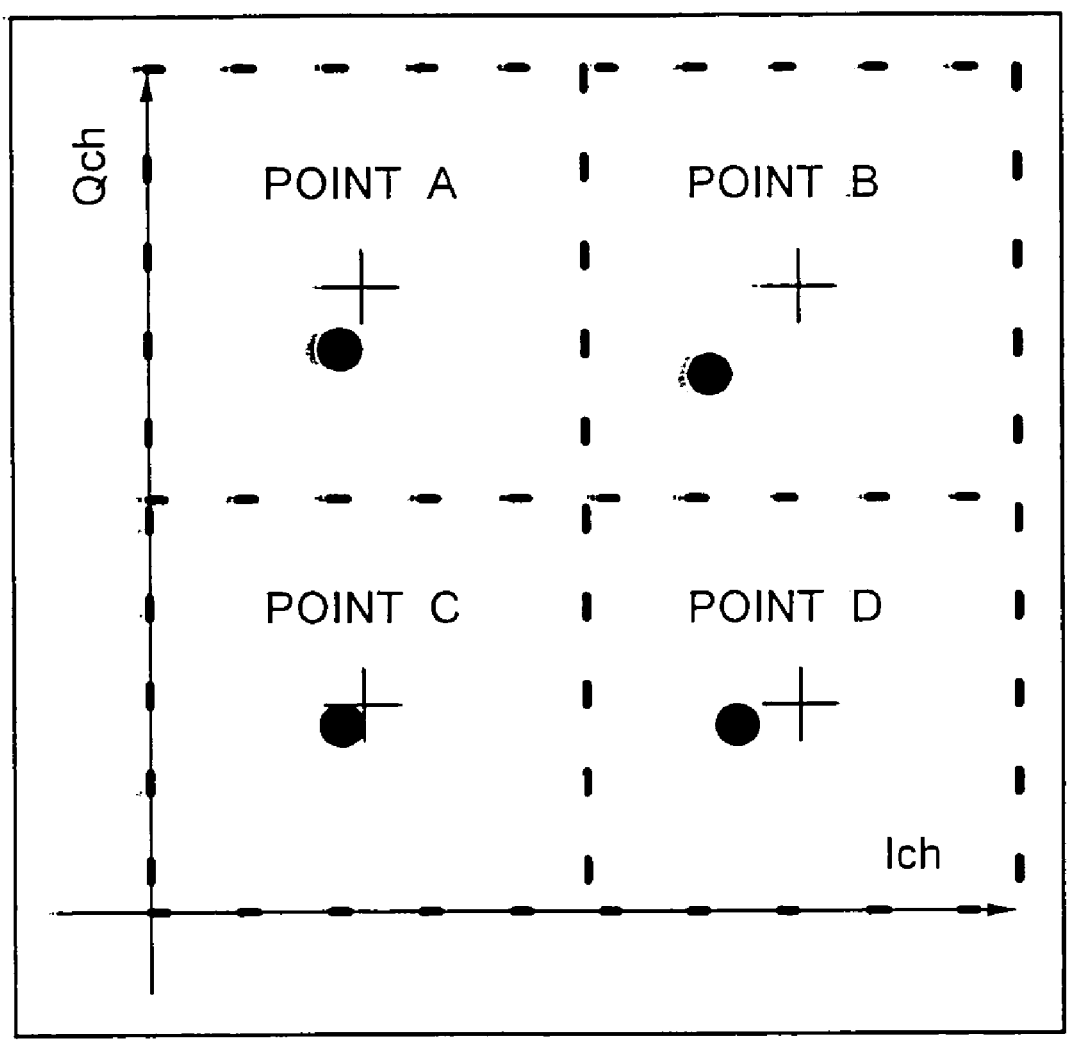
FIG. 12 is a chart showing an signal point arrangement on a first quadrant being affected by nonlinear distortions of 16 QAM signals.
Figure 13:
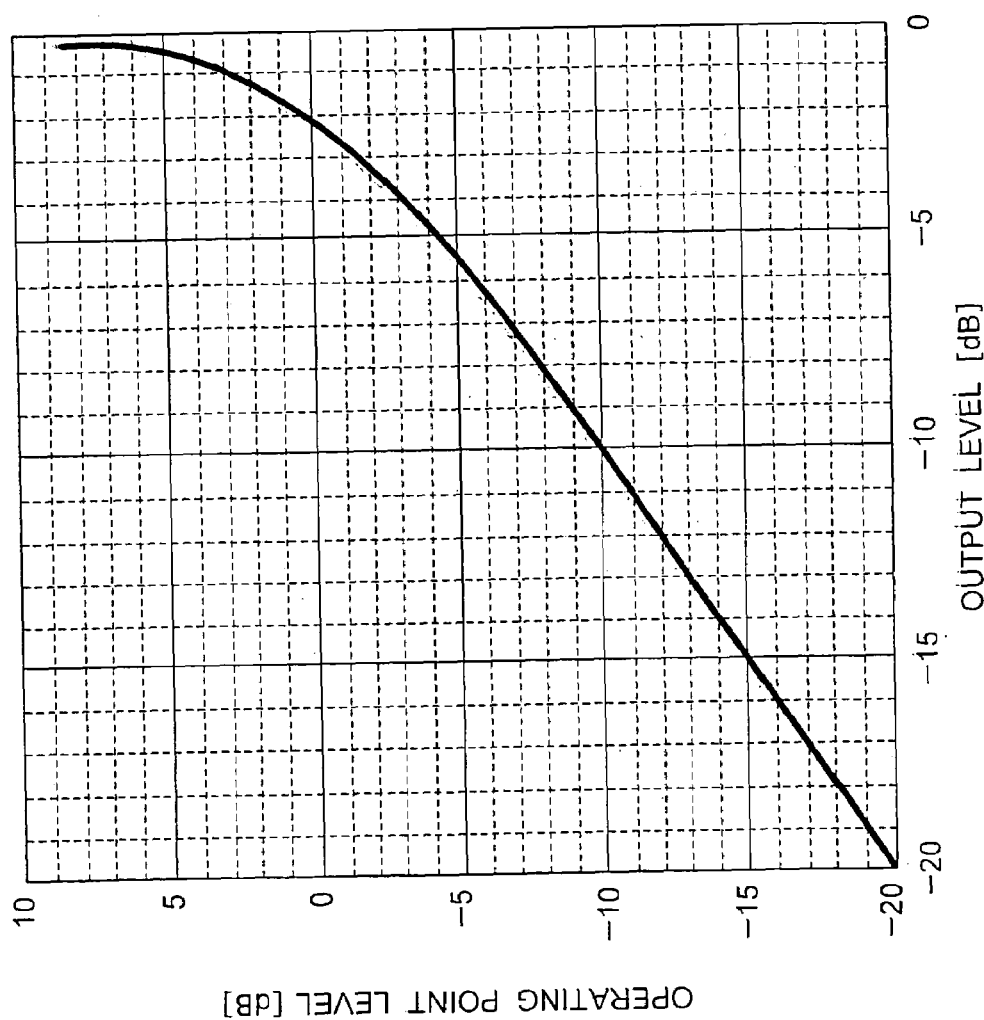
FIG. 13 is a graph showing the characteristics of the operating point level with reference to the output level.
Figure 14:
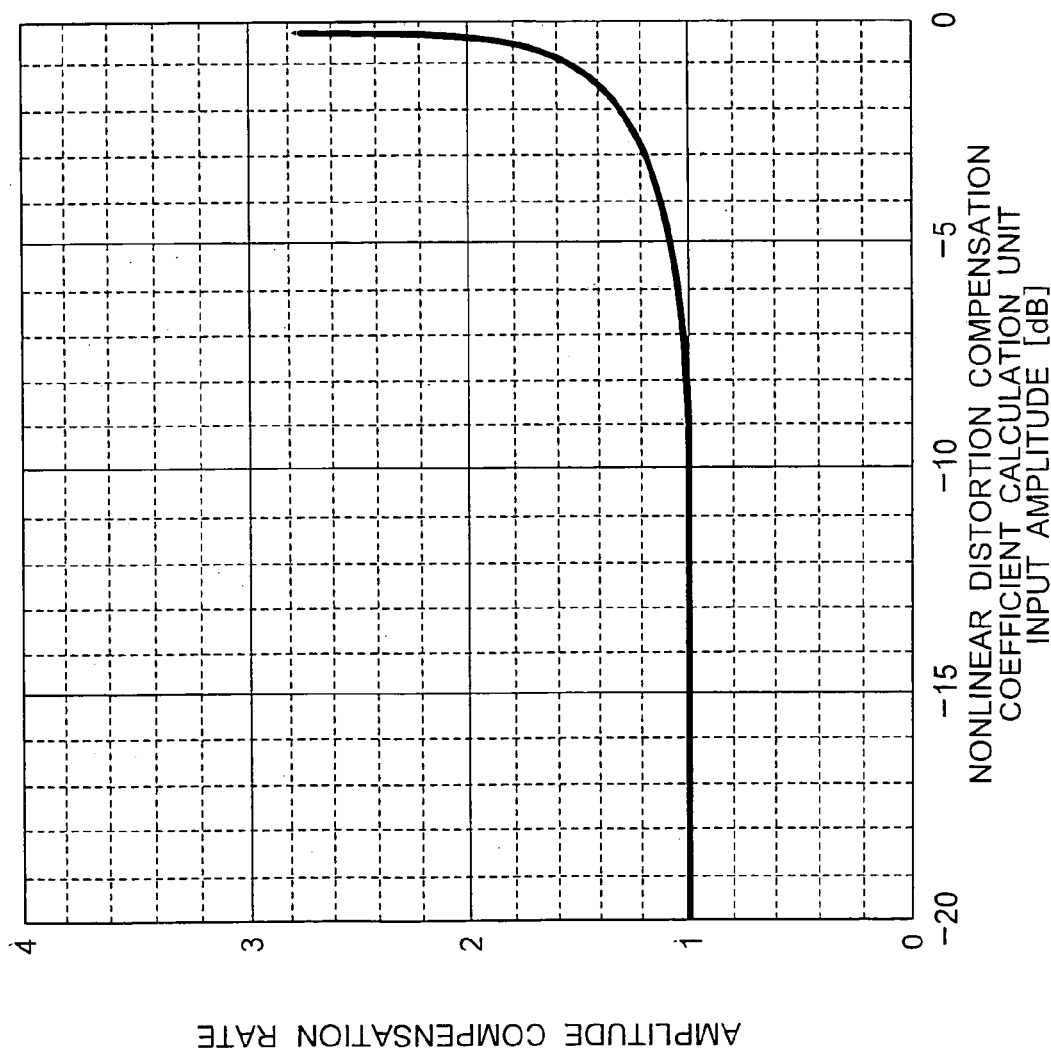
FIG. 14 is a graph showing the amplitude compensation ratio of the quadrature demodulator to the input amplitude.
Figure 15:
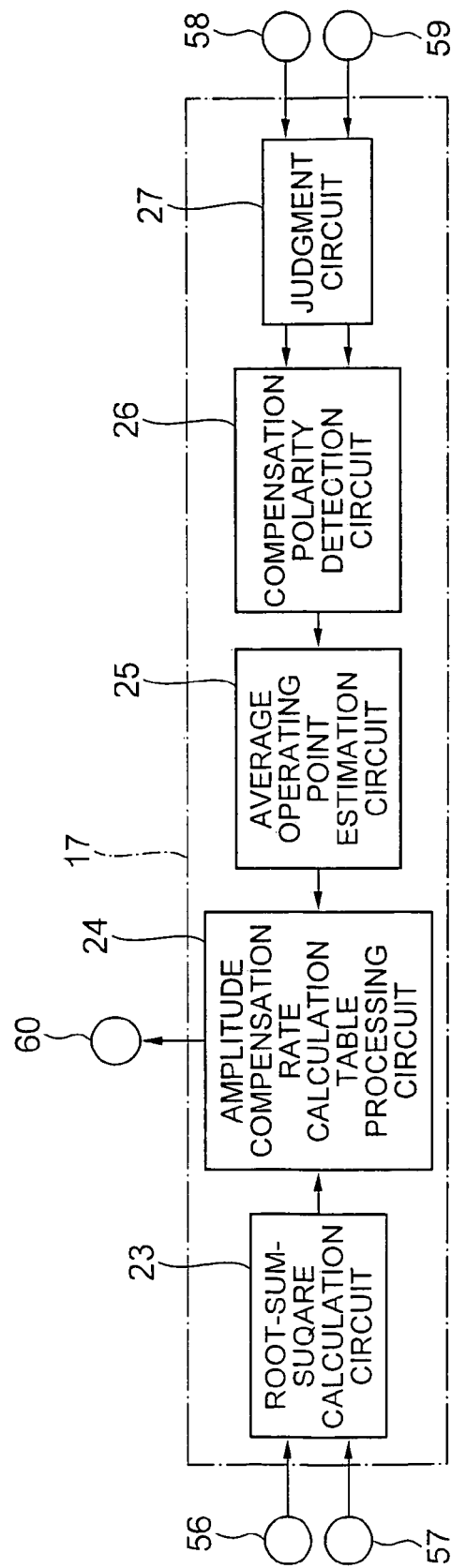
FIG. 15 is a block diagram showing the configuration of the nonlinear distortion compensation coefficient calculation unit.
Figure 16:
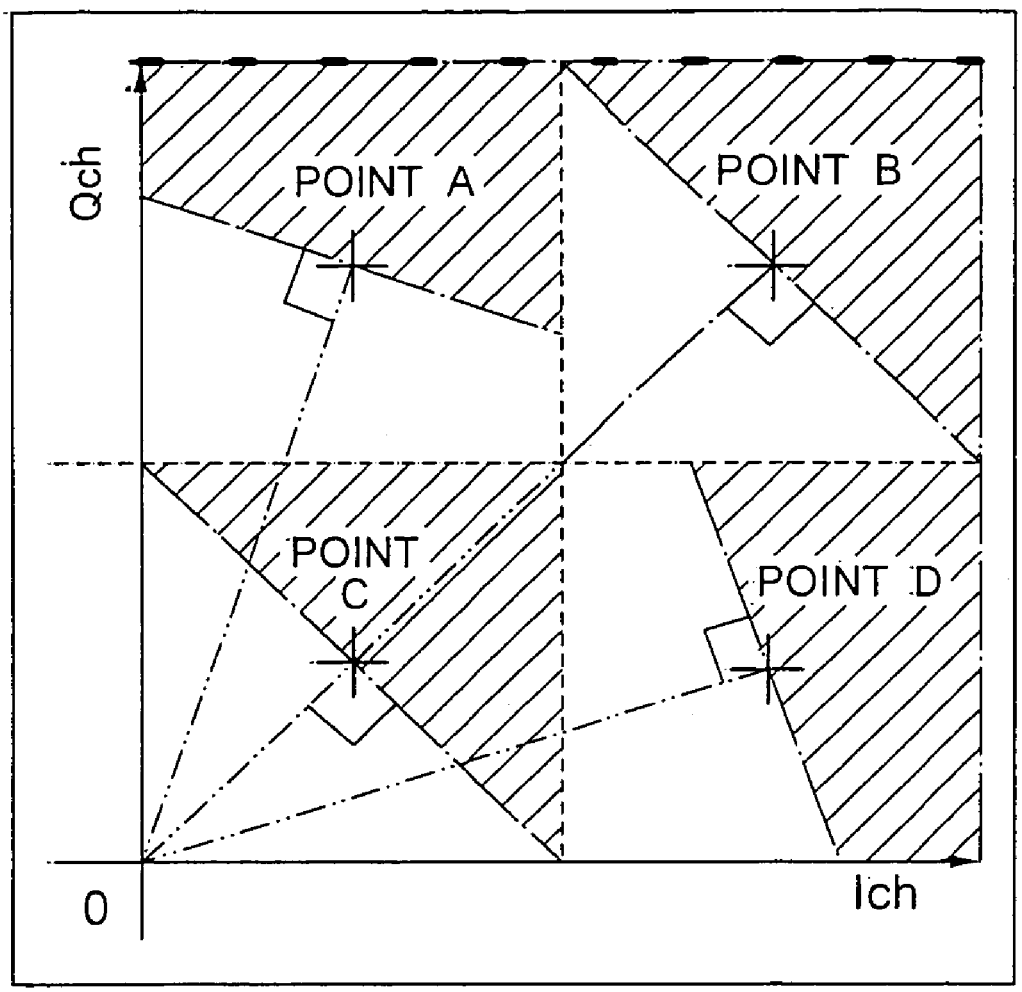
FIG. 16 is a chart showing an example of a compensation polarity detection area for detecting an influence of distortions from a signal point arrangement.
Figure 17:
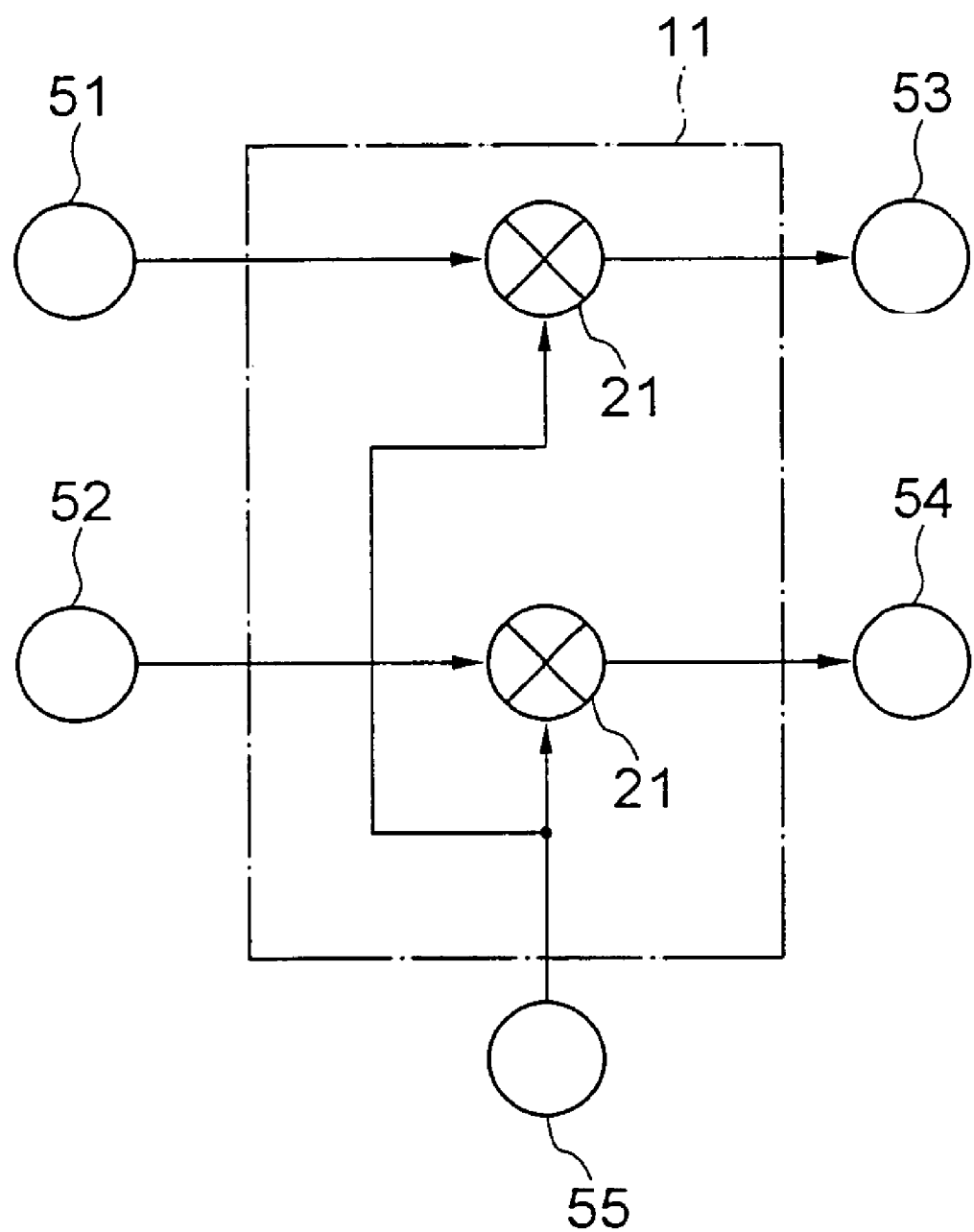
FIG. 17 is a block diagram showing the configuration of the nonlinear distortion compensation processing unit.

A transmitter according to an embodiment of the present invention will be described in detail below with reference to the drawings. FIG. 1 is a block diagram showing the constitution of a transmitter according to the present embodiment. As shown in FIG. 1, a transmission method of the present invention is for compensating for nonlinear distortions caused by amplifying modulated signals obtained by modulating baseband signals to have a radio frequency band. In the method, in addition to the nonlinear distortions, linear distortions are also compensated by adding inverse characteristics of linear distortion characteristics that the amplified, modulated signals have. A transmitter for performing such a transmission method includes, in addition to the configuration shown in FIG. 9, a linear distortion compensation processing unit 12, a phase uncertainty removal circuit 16, and a linear distortion compensation coefficient calculation unit 18. It should be noted that linear distortions may be compensated before nonlinear distortions are compensated, or nonlinear distortions may be compensated before linear distortions are compensated.

The transmitter of the present invention compensates for nonlinear distortions generated in the high output amplifier 14 with an RF band, in the nonlinear distortion compensation processing unit 11, and is further provided with a function of compensating for incompleteness of amplitude delay characteristics or an intrinsic deviation that the quadrature modulator 13 or the high output amplifier 14 have, in order that the effect of the nonlinear distortion compensation can be fully exhibited.

Next, the transmitter of the present embodiment will be described more specifically. The linear distortion compensation coefficient calculation unit 18 has a function of estimating linear distortion characteristics caused by incompleteness of an analog circuit mainly such as the quadrature modulator 13 or the high output amplifier 14, based on quadrature demodulated signals I'ch and Q'ch output from the phase uncertainly removal circuit 16, and calculating and outputting a linear distortion compensation coefficient for compensating for linear distortions. The linear distortion compensation processing unit 12 has a function of performing a predistortion (addition of inverse characteristics of linear distortion characteristics) by adding data of the linear distortion compensation coefficient, output from the linear distortion compensation coefficient calculation unit 18, to the baseband signals Ich and Qch output from the nonlinear compensation processing unit 11.

The nonlinear distortion compensation coefficient calculation unit 17 shown in FIG. 1 has a function of estimating nonlinear distortion characteristics caused by incompleteness of an analog circuit mainly such as the quadrature modulator 13 or the high output amplifier 14, based on quadrature demodulated signals I'ch and Q'ch output from the phase uncertainly removal circuit 16, and calculating and outputting a nonlinear distortion compensation coefficient for compensating for nonlinear distortions. The nonlinear distortion compensation processing unit 11 has a function of performing a predistortion (addition of inverse characteristics of linear distortion characteristics) by adding data of the nonlinear distortion compensation coefficient, output from the nonlinear distortion compensation coefficient calculation unit 17, to the baseband signals Ich and Qch output from the terminals 1 and 2.

Therefore, when the quadrature demodulated signal I'ch and Q'ch output from the phase uncertainty removal circuit 16 are input into the linear distortion compensation coefficient calculation unit 18, the linear distortion compensation coefficient calculation unit 18 estimates linear distortion characteristics caused by incompleteness of an analog circuit mainly such as the quadrature modulator 13 or the high output amplifier 14 based on the quadrature demodulated signals I'ch and Q'ch, calculates a linear distortion compensation coefficient for compensating for the linear distortions, and outputs the data to the linear distortion compensation processing unit 12. Then, when the data of the linear distortion compensation coefficient output from the linear distortion compensation coefficient calculation unit 18 is input into the linear distortion compensation processing unit 12, the linear distortion compensation processing unit 12 performs predistortion (addition of inverse characteristics of linear distortion characteristics) by adding the data of the linear distortion compensation coefficient to the baseband signals Ich and Qch output from the nonlinear distortion compensation processing unit 11.

When the quadrature demodulated signals I'ch and Q'ch are output from the phase uncertainty removal circuit 16 are input into the nonlinear distortion compensation coefficient calculation unit 17, the nonlinear distortion compensation coefficient calculation unit 17 estimates the nonlinear distortion characteristics caused by incompleteness of an analog circuit mainly such as the quadrature modulator 13 or the high output amplifier 14 based on the quadrature demodulated signals I'ch and Q'ch, calculates an nonlinear distortion compensation coefficient for compensating for the nonlinear distortion, and output the data to the nonlinear distortion compensation processing unit 11. Then, when the data of the nonlinear distortion compensation coefficient output from the nonlinear distortion compensation coefficient calculation unit 17 is input into the nonlinear distortion compensation processing unit 11, the nonlinear distortion compensation processing unit 11 performs predistortion (addition of inverse characteristics of linear distortion characteristics) by adding the data of the nonlinear distortion compensation coefficient to the baseband signals Ich and Qch output from the terminals 1 and 2.

As described above, in addition to a compensation of nonlinear distortions caused by amplifying modulated signals obtained by modulating the baseband signals to have a radio frequency (RF) band, a linear distortion compensation is performed by adding inverse characteristics of linear distortion characteristics that the amplified, modulated signals have (that is, predistortion). Therefore, in the transmitter of the present embodiment, respective transmitted symbols input from the terminals 1 and 2 are performed predistortion in the nonlinear distortion compensation processing unit 11 and the linear distortion compensation processing unit 12, respectively, and are modulated into RF signals by the quadrature modulator 13, are amplified by the high output amplifier 14, and are output from the terminal 3.

Note that in the transmitter of the present embodiment, the baseband signals (quadrature demodulated signals) I'ch and Q'ch are independently (that is, in the state of two dimension) input for feedback so as to operate the nonlinear distortion compensation calculation unit 17 and the linear distortion compensation coefficient calculation unit 18, whereby phase uncertainties of the quadrature-modulated feedback signals are removed in the phase uncertainty removal circuit 16

Figure 2:
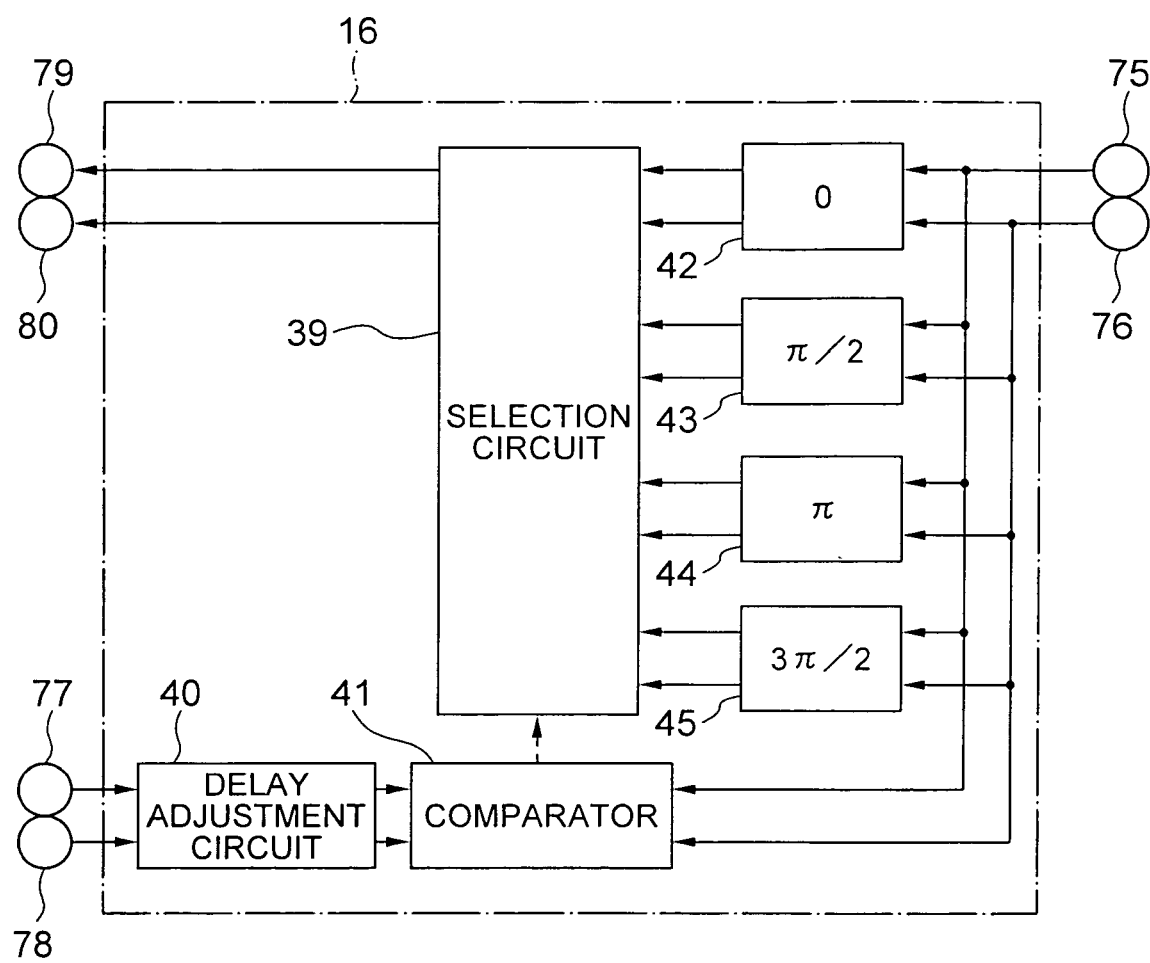
FIG. 2 is a block diagram showing an exemplary configuration of the phase uncertainty removal circuit.

FIG. 2 is a block diagram showing an exemplary constitution of the phase uncertainty removal circuit 16 shown in FIG. 1. As shown in FIG. 2, the phase uncertainty removal circuit 16 has a function of removing phase uncertainties of the quadrature demodulated signals I'ch and Q'ch output from the quadrature demodulator 15. The phase uncertainty removal circuit 16 comprises: a delay adjustment circuit 40 for adjusting a timing of the transmitted symbols input from terminals 77 and 78 connected with the terminals 1 and 2, and the quadrature signals I'ch and Q'ch from the quadrature demodulator 15; a comparator 41 for comparing the transmitted symbols input from the terminals 77 and 78 with the quadrature demodulated signals I'ch and Q'ch from the quadrature demodulator 15, and determining the phase difference thereof; and a selection circuit 39 for selecting an output from a phase rotation adding circuit 42 to 45 corresponding to the result determined by the comparator 41, and outputting the quadrature demodulated signals I'ch and Q'ch in which phase uncertainties are removed. To the terminals 75 and 76 of the phase uncertainty removal circuit 16, the quadrature demodulated signals I'ch and Q'ch from the quadrature demodulator 15 are input, and to the terminals 77 and 78, the transmitted symbols from the terminals 1 and 2 are input. Further, the quadrature demodulator 15 is so configured as to output the quadrature demodulated signals I'ch and Q'ch obtained by demodulating the modulated signal amplified by the high output amplifier 14.

When the transmitted symbols are input into the delay adjustment circuit 40 of the phase uncertainty removal circuit 16 through the terminals 77 and 78, the delay adjustment circuit 40 performs delay adjustments of timings of the transmission symbols and the quadrature demodulated signals, and outputs the signals to the comparator 41. When the delay adjusted signals and the quadrature demodulated signals I'ch and Q'ch from the terminals 75 and 76 are input into the comparator 41, the comparator 41 compares the signals delay-adjusted in the delay adjustment circuit 40 with the quadrature demodulated signals I'ch and Q'ch so that the timing of the quadrature demodulated signals I'ch and Q'ch and the transmitted symbols coincide with each other, and then determines whether the phase difference between the both signals is 0, $\pi/2$, $\pi$ or $3\pi/2$. When the signal, which is the comparison result from the comparator 41, is input into the selection circuit 39, the selection circuit 39 selects one output (0, $\pi/2$, $\pi$, $3\pi/2$) from the phase rotation adding circuit 42, 43, 44 or 45, corresponding to the result determined in the comparator 41, whereby removes phase uncertainties in the quadrature demodulated signals I'ch and Q'ch, and outputs the quadrature demodulated signals I'ch and Q'ch in which the phase uncertainties are removed. The output of the selection circuit 39 is output to the nonlinear distortion coefficient calculation unit 17 and to the linear distortion compensation coefficient calculation unit 18 through the terminals 79 and 80.

Figure 3:
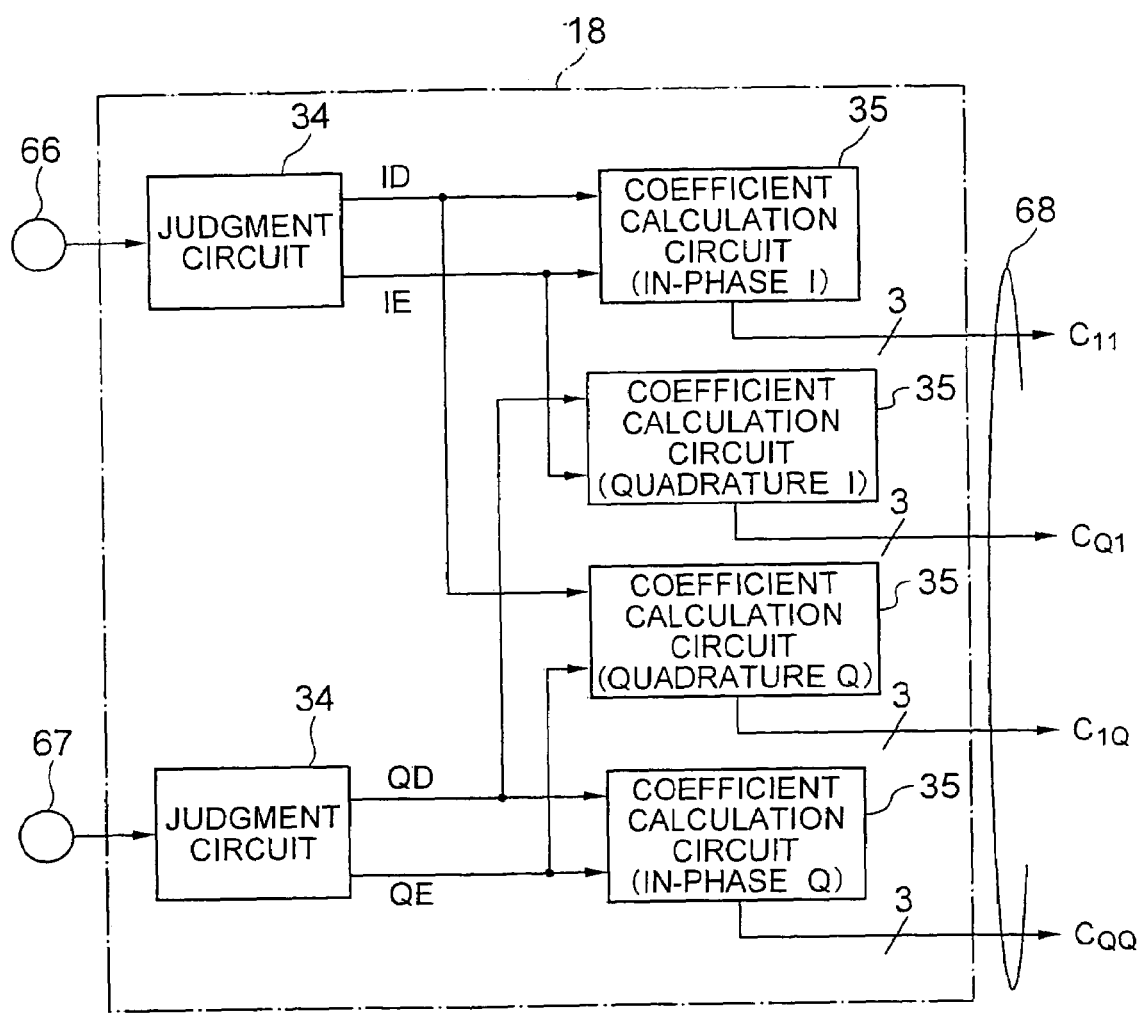
FIG. 3 is a block diagram showing an exemplary configuration of the linear distortion compensation coefficient calculation unit.

FIG. 3 is a block diagram showing an exemplary configuration of the linear distortion compensation coefficient calculation unit 18 shown in FIG. 1. As shown in FIG. 3, the linear distortion compensation coefficient calculation unit 18 has a function of calculating and outputting a linear distortion compensation coefficient for compensating for linear distortions included in the quadrature demodulated signals I'ch and Q'ch from the phase uncertainty removal circuit 16, and comprises, terminals 66 to 68, two judgment circuits 34, and linear distortion compensation coefficient calculation circuits 35 of four systems, that is, Ich in-phase, Ich quadrature, Qch in-phase, and Qch quadrature.

To the terminals 66 and 67, quadrature demodulated signals I'ch and Q'ch output from the phase uncertainty removal circuit 16 (terminals 79 and 80 in FIG. 2) are input, respectively. Two judgment circuits 34 have a function of judging transmitted symbols according to the quadrature demodulated signals input from the terminal 66 and 67, and reproducing and outputting data signals (reproduction of transmitted signals) ID and QD, and error signals IE and QE, of respective channels.

Here, the data signal ID from the judgment circuit 34 is input into the linear distortion compensation coefficient circuits 35 of Ich in-phase and Qch quadrature, respectively, and the error signal IE is input into the linear distortion compensation coefficient calculation circuits 35 of Ich in-phase and Ich quadrature, respectively. Further, the data signal QD from the judgment circuit 34 is input into the linear distortion compensation coefficient calculation circuits 35 of Qch in-phase and Ich quadrature, respectively, and the error signal QE is input into the linear distortion compensation calculation circuits 35 of Qch in-phase and Qch quadrature, respectively.

Therefore, when the quadrature demodulated signals I'ch and Q'ch from the phase uncertainty removal circuit 16 are input into the judgment circuits 34 through the terminals 66 and 67, the two judgment circuits 34 reproduce data signals (reproduction of transmitted signals) ID and QD and error signals IE and QE respectively, for each of the quadrature demodulated signals I'ch and Q'ch, and output them to the linear distortion compensation coefficient calculation circuits 35 of four systems, that is, Ich in-phase, Ich quadrature, Qch in-phase, and Qch quadrature. Then, respective linear distortion compensation coefficient circuits 35 calculate linear distortion compensation coefficients of in-phase and quadrature for respective channels, based on the data signals ID and QD and the error signals IE and QE, respectively, by using, as inputs, the linear distortion compensation coefficient for compensating linear distortions included in the quadrature demodulated signals I'ch and Q'ch, that is, data signals ID and QD and the error signals IE and QE of respective channels, and the linear distortion compensation coefficient circuits 35 output data of the linear distortion compensation coefficients (CII, CQI, CIQ, CQQ), which are the calculation results, from the terminal 68. In FIG. 3, lines to the terminal 68 of respective linear distortion compensation coefficient calculation circuits 35 are indicated with the "numeral 3, and a slash /", indicating that each linear distortion compensation coefficient circuit 35 outputs tap coefficients (C+1, C0, C−1) as linear distortion compensation coefficients from three terminals (terminals 74 in FIG. 4).

Figure 4:
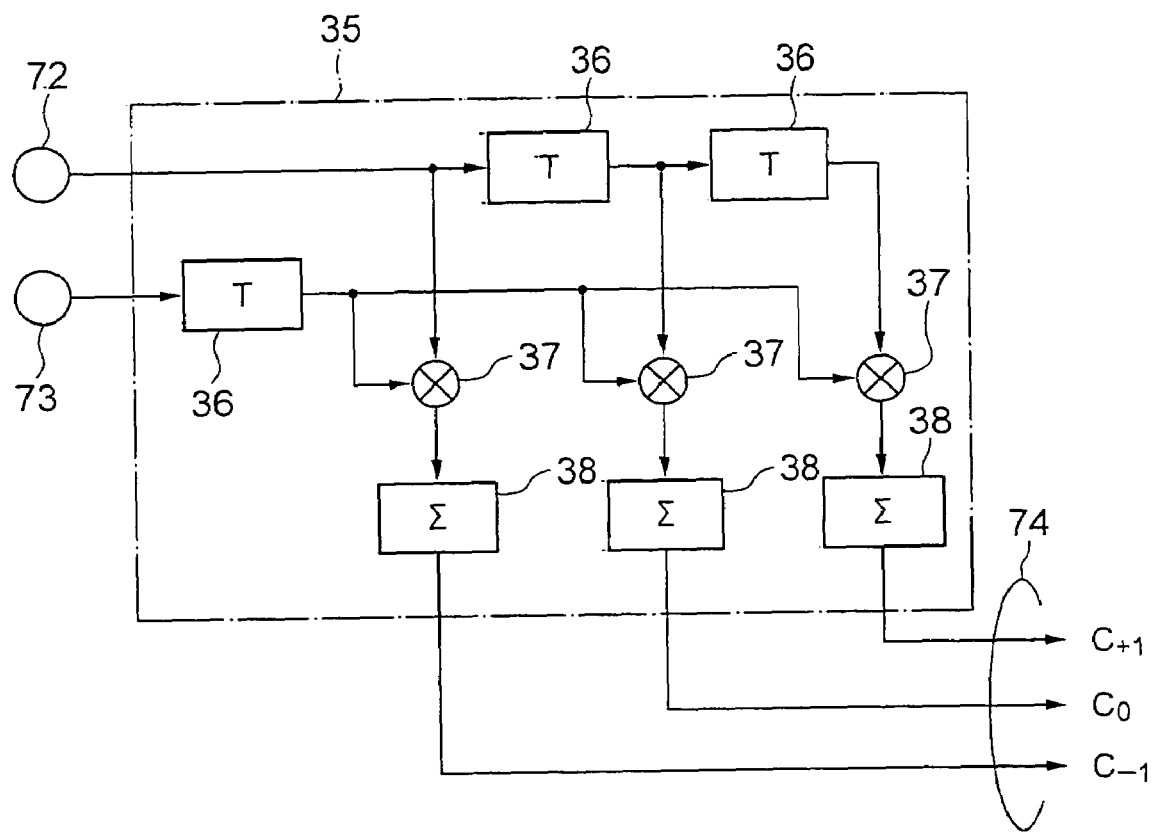
FIG. 4 is a block diagram showing an exemplary configuration of the linear distortion compensation coefficient calculation circuit.

FIG. 4 is a block diagram showing an exemplary configuration of each linear distortion compensation coefficient calculation circuit 35 shown in FIG. 3. As shown in FIG. 4, the linear distortion compensation coefficient circuit 35 comprises: terminals 72 and 73 to which the data signals (ID, QD) and the error signals (IE, QE) from the judgment circuits 34 are input, three delay elements 36, three correlators 37, three integrators 38, and a terminal 74 from which data of tap coefficients (C+1, C0, C−1) from the integrators are output. The linear distortion compensation coefficient calculation circuit 35 shown in FIG. 4 is a tap coefficient calculation circuit of three-tap transversal filter, and the calculation of the tap coefficients (C+1, C0, C−1) performed in the linear distortion compensation coefficient calculation circuit 35 is same as the operation of a well-known linear equalizer, whereby the detail explanations are omitted.

Figure 5:
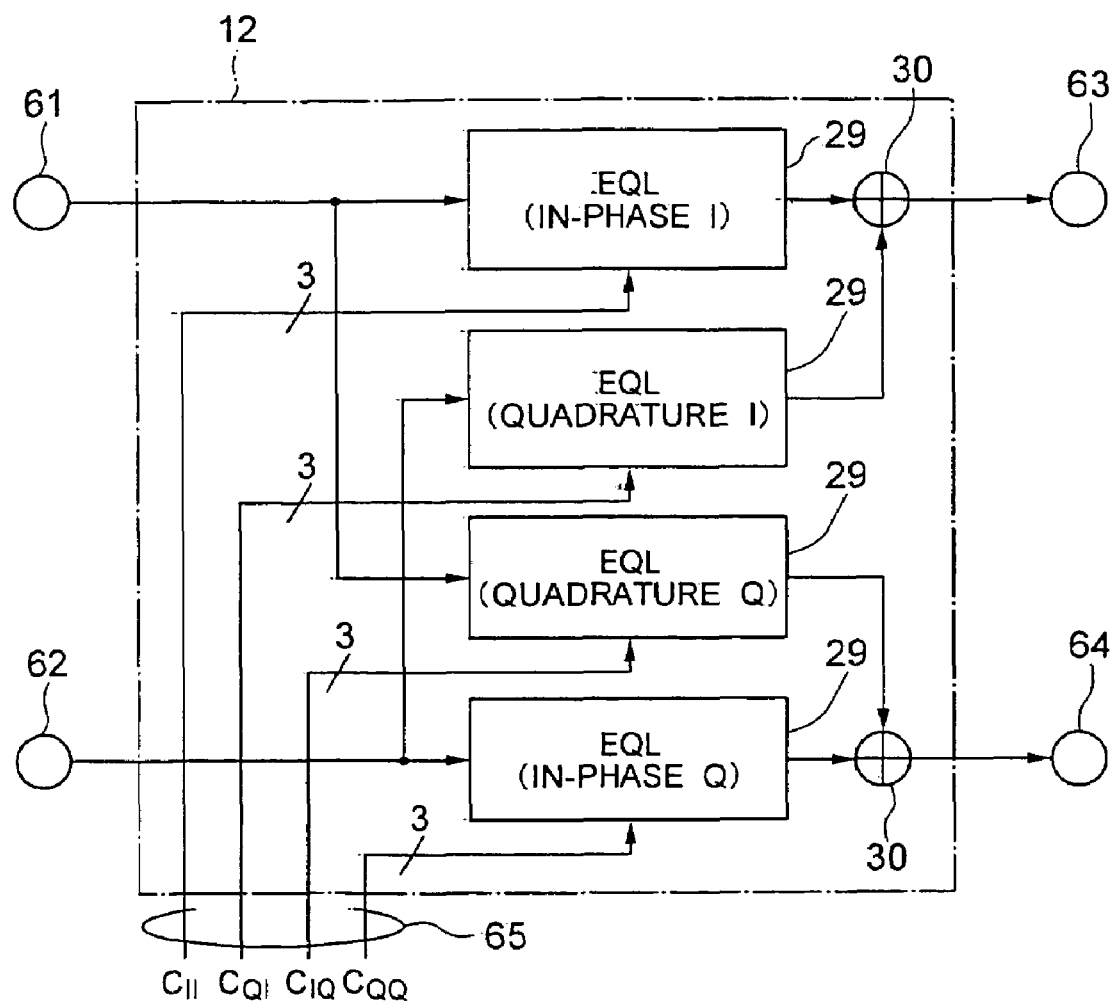
FIG. 5 is a block diagram showing an exemplary configuration of the linear distortion compensation processing unit.

FIG. 5 is a block diagram showing an exemplary configuration of the linear distortion compensation processing unit 12 shown in FIG. 1. As shown in FIG. 5, the linear distortion compensation processing unit 12 has a function of multiplying the baseband signals (Ich, Qch) from the nonlinear distortion compensation processing unit 11 by data of linear distortion compensation coefficient from the linear distortion compensation coefficient calculation unit 18, and outputting the resultant signals, and comprises: terminals 61 and 62 into which baseband signals from the nonlinear distortion compensation processing unit 11 are input, four transversal filters 29, and two adders 30.

The four transversal filters 29 are four system transversal filters of Ich in-phase, Ich quadrature, Qch in-phase, and Qch quadrature, respectively. The baseband signal Ich input into the terminal 61 is input into the Ich in-phase transversal filter 29 and the Qch quadrature transversal filter 29, respectively, and the baseband signal Qch is input into the Qch in-phase transversal filter 29 and the Ich quadrature transversal filter 29, respectively.

Further, the four-system transversal filters 29 of Ich in-phase, Ich quadrature, Qch in-phase and Qch quadrature, performs linear distortion compensation based on the coefficients (CII, CQI, CIQ, CQQ) input from the linear distortion compensation coefficient calculation unit 18 through the terminal 65. Each piece of data of the linear distortion compensation coefficients (CII, CQI, CIQ, CQQ) includes data of three tap coefficients (C+1, C, C−1), respectively.

Further, one adder 30 adds an in-phase component from the Ich in-phase transversal filter 29 and a quadrature component from the Ich quadrature transversal filter 29 and outputs the resultant, and the other adder 30 adds an in-phase component from the Qch in-phase transversal filter 29 and a quadrature component from the Qch quadrature transversal filter 29 and outputs the resultant. Further, the output signals from respective adders 30 are output through the terminals 63 and 64 to the quadrature modulator 13.

Thus, when the baseband signals Ich and Qch from the nonlinear distortion compensation processing unit 11 are input into the terminals 61 and 62, these baseband signals Ich and Qch are input into the four transversal filters 29, as described above. Then, the four-system transversal filters 29 of Ich in-phase, Ich quadrature, Qch in-phase and Qch quadrature perform linear distortion compensation based on the data of linear distortion compensation coefficients (CII, CQI, CIQ, CQQ), which are input from the linear distortion compensation coefficient calculation unit 18 through the terminal 65. One adder 30 adds an in-phase component and a quadrature component of the Ich transversal filter 29 and outputs the resultant, and the other adder 30 adds an in-phase component and a quadrature component of the Qch transversal filter 29 and outputs the resultant. The outputs of respective adders 30 are output to the outside through the terminals 63 and 64.

Figure 6:
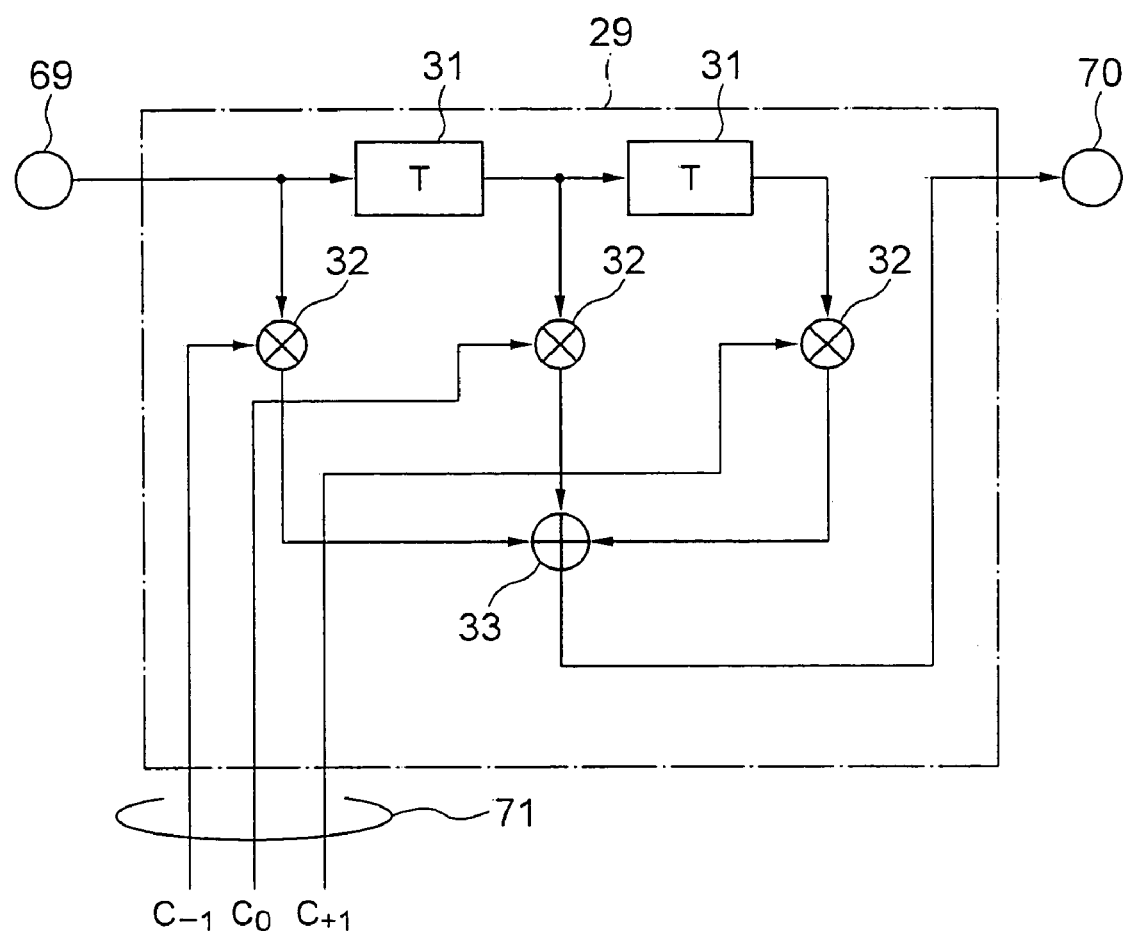
FIG. 6 is a block diagram showing an exemplary configuration of a transversal filter.

FIG. 6 is a block diagram showing an exemplary configuration of a transversal filter 29 shown in FIG. 5. As shown in FIG. 6, the transversal filter 29 is a transversal filter operable at a clock rate, and is configured as a three-tap linear equalizer comprising two delay elements 31, three multipliers 32, and one adder 33.

To the multipliers 32, the tap coefficients, C+1, C0 and C−1, output from the linear distortion compensation coefficient calculation circuit 35 are input through the terminal 71, in which signals from the terminal 69 are directly input into a first multiplier 32, signals passing through one delay element 31 are input into a second multiplier 32, and signals passing through two delay elements 31 are input into a third multiplier 32. Then, signals from three multipliers 32 are input into the adder 33, and signals from the adder 33 are output to the adder 30 shown in FIG. 5 through the terminal 70.

The number of taps of the transversal filter 29 are not limited, and instead of the transversal filter operable at a clock rate shown in FIG. 6, a fractional-type transversal filter operable at a multiplication of the clock rate may be applied. Each tap coefficient of the transversal filter is calculated and supplied by the linear distortion compensation calculation unit 18. It should be noted that the operation of the transversal filter 29 is same as that of a well known linear equalizer, whereby the detail explanations are omitted.

As described above, the transmitter of the present invention compensates for nonlinear distortions caused by amplifying modulated signals, and also compensates for linear distortions. Thereby, an influence of incompleteness of amplitude delay characteristics or an intrinsic deviation that an analog circuit has, is eliminated by performing the linear distortion compensation, so that an ideal nonlinear distortion compensation can be carried out.

Figure 7:
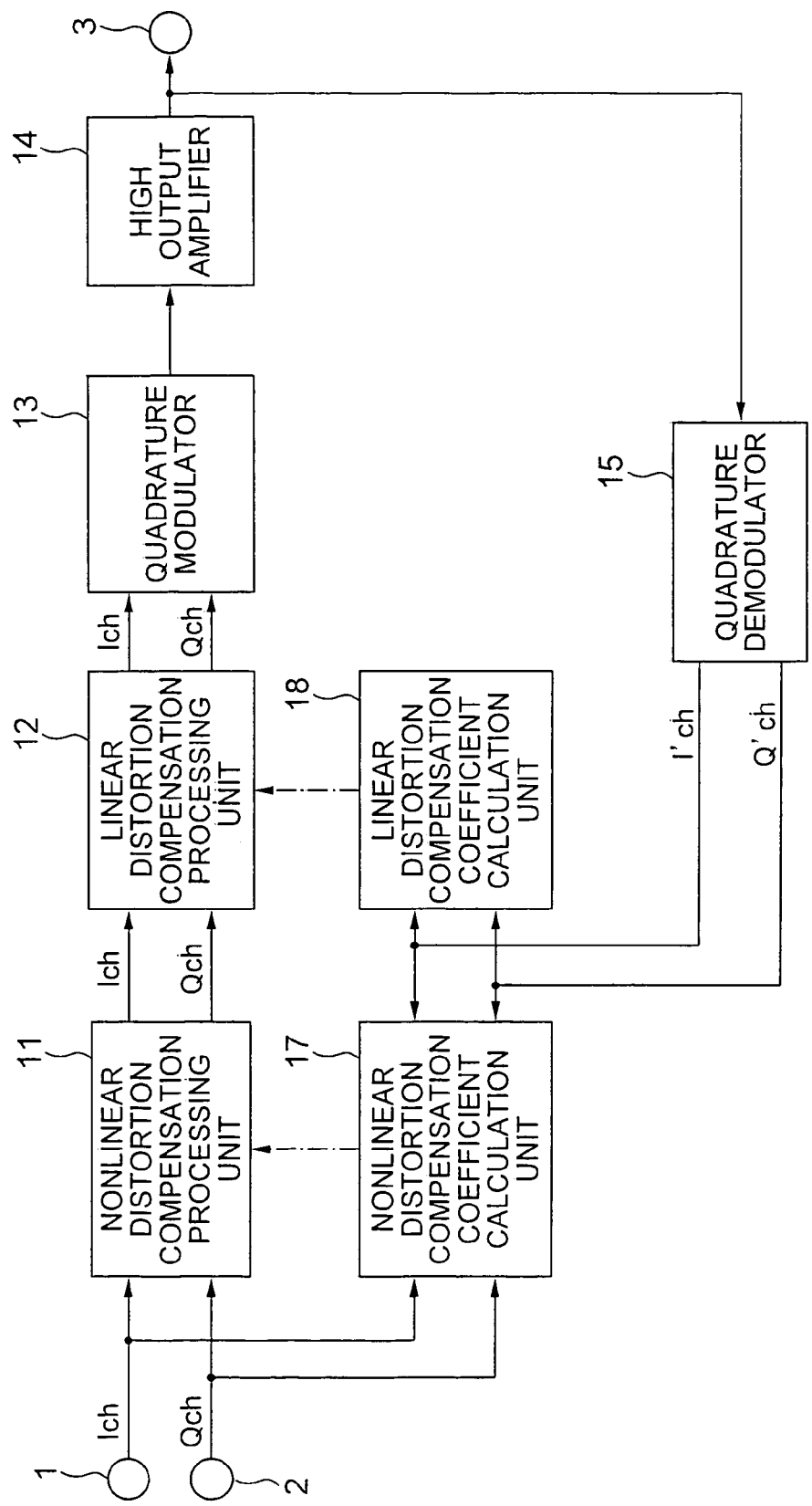
FIG. 7 is a block diagram showing an exemplary configuration of a case where a phase uncertainty removal circuit is excluded.

In the transmitter of the present invention, phase decision is performed by the phase uncertainty removal circuit 16 in order to enhance the accuracy of the predistortion. However, linear distortion compensation and nonlinear distortion compensation may be performed without carrying out the phase decision by the phase uncertainty removal circuit 16. FIG. 7 shows the configuration of the transmitter where the phase uncertainty removal circuit is excluded.

Figure 8:
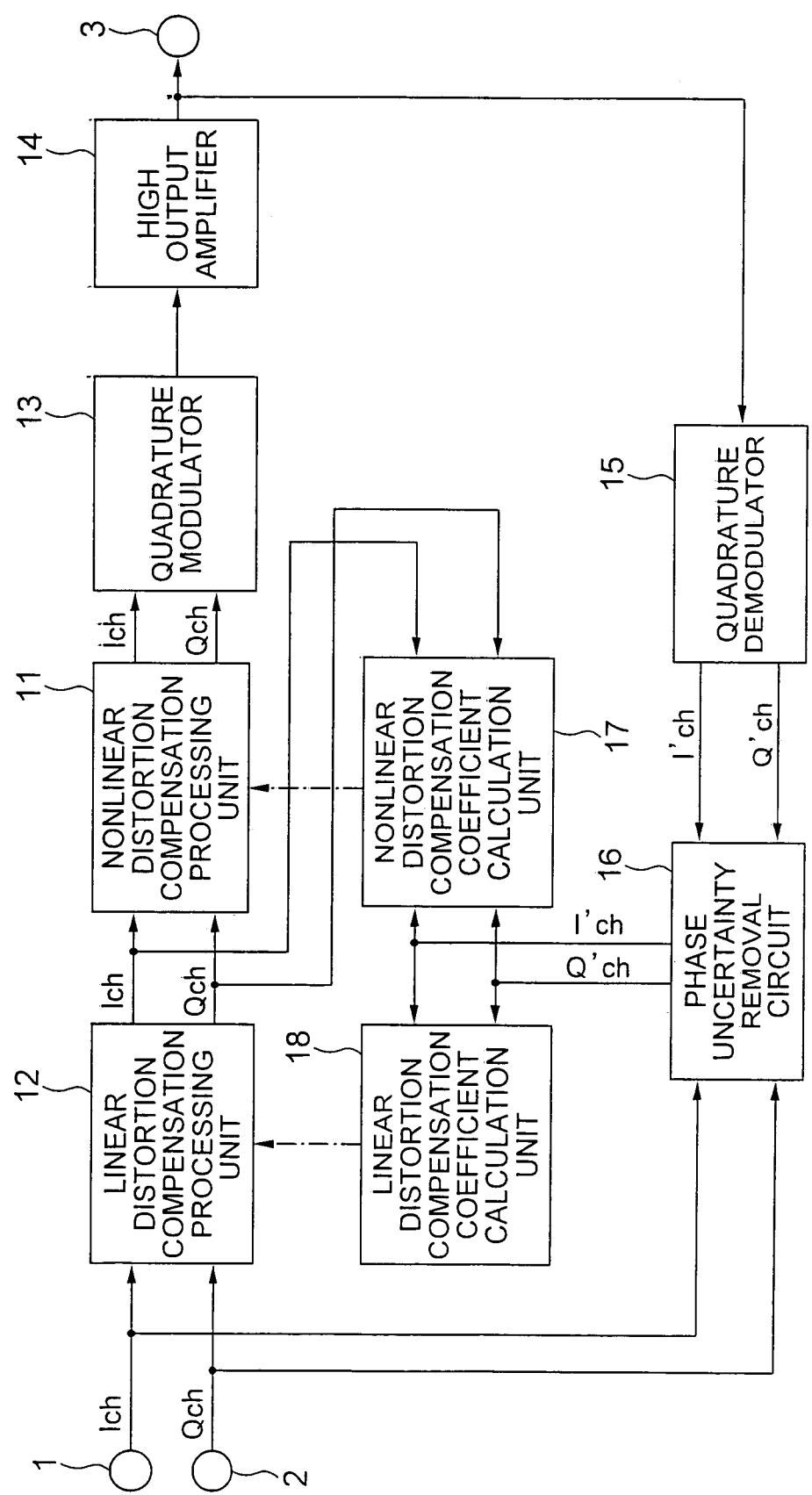
FIG. 8 is a block diagram showing a deformed example of the configuration of the transmitter.

Further, in the transmitter of the present invention, the nonlinear distortion compensation processing unit 11 is provided in the preceding stage to the linear distortion compensation processing unit 12, and the linear distortion compensation is performed first, followed by the nonlinear distortion compensation. However, the linear distortion compensation processing unit 12 may be provided in the preceding stage to the nonlinear distortion compensation processing unit 11, whereby the linear distortion compensation may be performed first, followed by the nonlinear distortion compensation. FIG. 8 shows the configuration of the transmitter in such a case.

INDUSTRIAL APPLICABILITY

As described above, the present invention performs predistortion for compensating for linear distortions, in addition to nonlinear distortions caused by incompleteness of an analog circuit, whereby it is possible to enhance the accuracy of the predistortion for compensating for linear distortions of a high output amplifier, and to perform an ideal nonlinear distortion compensation.

What is claimed is:

1. A transmitter in which a nonlinear distortion is compensated, the nonlinear distortion being caused by amplifying a modulated signal obtained by modulating a baseband signal to have a radio frequency band, comprising:
   - a quadrature demodulator which outputs a quadrature demodulated signal obtained by demodulating the modulated signal;
   - a linear distortion compensation coefficient calculation unit for calculating and outputting a linear distortion compensation coefficient for compensating for a linear distortion contained in the quadrature demodulated signal; and
   - a linear distortion compensation processing unit for multiplying the baseband signal by data of the linear distortion compensation coefficient and outputting a resultant signal, wherein
   - the linear distortion compensation coefficient calculation unit comprises: a judgment circuit for judging a transmitted symbol according to the quadrature demodulated signal, and reproducing and outputting a data signal and an error signal for each channel; and a linear distortion coefficient calculation circuit for calculating and outputting an in-phase linear distortion compensation coefficient and a quadrature linear distortion compensation coefficient for each channel, respectively, by using the data signal and the error signal for each channel as an input.

2. The transmitter, as claimed in claim 1, wherein the linear distortion compensation processing unit includes a transversal filter operable at a clock rate.

3. The transmitter, as claimed in claim 2, wherein, instead of the transversal filter, a fractional-type transversal filter operable at a multiplication of the clock rate is used.

4. The transmitter, as claimed in claim 3, further comprising a phase uncertainty removal circuit for removing a phase uncertainty of the quadrature demodulated signal.

5. The transmitter, as claimed in claim 4, wherein the phase uncertainty removal circuit comprises: an adjustment circuit for adjusting a timing of the transmitted symbol and the quadrature demodulated signal; a comparator for comparing the transmitted symbol with the quadrature demodulated signal and determining a phase difference; and a selecting circuit for outputting an adjusted quadrature demodulated signal corresponding to a result determined by the comparator.

6. The transmitter, as claimed in claim 2, further comprising a phase uncertainty removal circuit for removing a phase uncertainty of the quadrature demodulated signal.

7. The transmitter, as claimed in claim 6, wherein the phase uncertainty removal circuit comprises: an adjustment circuit for adjusting a timing of the transmitted symbol and the quadrature demodulated signal; a comparator for comparing the transmitted symbol with the quadrature demodulated signal and determining a phase difference; and a selecting circuit for outputting an adjusted quadrature demodulated signal corresponding to a result determined by the comparator.

8. The transmitter, as claimed in claim 1, further comprising a phase uncertainty removal circuit for removing a phase uncertainty of the quadrature demodulated signal.

9. The transmitter, as claimed in claim 8, wherein the phase uncertainty removal circuit comprises: an adjustment circuit for adjusting a timing of the transmitted symbol and the quadrature demodulated signal; a comparator for comparing the transmitted symbol with the quadrature demodulated signal and determining a phase difference; and a selecting circuit for outputting an adjusted quadrature demodulated signal corresponding to a result determined by the comparator.

* * * * *